(12) United States Patent
Sugimura

(10) Patent No.: US 6,232,655 B1
(45) Date of Patent: *May 15, 2001

(54) SEMICONDUCTOR ELEMENT HAVING EXTERNAL CONNECTION TERMINALS, METHOD OF MANUFACTURING THE SEMICONDUCTOR ELEMENT, AND SEMICONDUCTOR DEVICE EQUIPPED WITH THE SEMICONDUCTOR ELEMENT

(75) Inventor: Masashi Sugimura, Kanagawa (JP)

(73) Assignee: Kabushiki Kaisha Toshiba, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/003,808

(22) Filed: Jan. 7, 1998

(30) Foreign Application Priority Data

Jan. 10, 1997 (JP) ................................................ 9-003192

(51) Int. Cl.$^7$ .............................. H01L 23/48; H01L 23/52
(52) U.S. Cl. ........................................... 257/690; 257/693
(58) Field of Search .................................... 257/690, 693, 257/696, 692, 686, 694, 695; 438/106, 123, 109

(56) References Cited

U.S. PATENT DOCUMENTS

| | | | |
|---|---|---|---|
| 3,349,481 | * 10/1967 | Karp | 257/692 |
| 4,794,092 | * 12/1988 | Solomon | 438/109 |
| 5,311,401 | * 5/1994 | Gates, Jr. et al. | 361/760 |
| 5,347,159 | * 9/1994 | Khandros et al. | 257/692 |
| 5,808,872 | * 9/1998 | Ozawa | 361/760 |
| 5,818,107 | * 10/1998 | Pierson et al. | 257/723 |
| 5,925,928 | * 7/1999 | Hafner et al. | 257/679 |

FOREIGN PATENT DOCUMENTS 3-104246  5/1991  (JP).

* cited by examiner

Primary Examiner—Olik Chaudhuri
Assistant Examiner—Phat Xuan Cao
(74) Attorney, Agent, or Firm—Finnegan, Henderson, Farabow, Garrett & Dunner, L.L.P.

(57) ABSTRACT

External connection terminals (25) are disposed on side surfaces, a back surface, or both the side surfaces and the back surface of a semiconductor element, especially an optical element (20) such as an image sensor, a solid state imaging device, etc. The external connection terminals (25) are connected electrically to an integrated circuit (21) of the optical element (20) via wirings (23). The wirings (23) are connected electrically to electrical measuring electrodes (23T) in the course of wafer process, but the electrical measuring electrodes (23T) are disconnected from the wirings (23) after the electrical measurement has been completed. The electrical measuring electrodes (23T) are formed on dicing lines and then removed at the same time when dicing process is executed. The external connection terminals (25) are connected to the wirings (23) from which the electrical measuring electrodes (23T) are disconnected.

14 Claims, 11 Drawing Sheets

PRIOR ART

PRIOR ART

*PRIOR ART*

PRIOR ART

SEMICONDUCTOR ELEMENT HAVING EXTERNAL CONNECTION TERMINALS, METHOD OF MANUFACTURING THE SEMICONDUCTOR ELEMENT, AND SEMICONDUCTOR DEVICE EQUIPPED WITH THE SEMICONDUCTOR ELEMENT

BACKGROUND OF THE INVENTION

1. Field of the Invention

The present invention relates to a semiconductor element having external connection terminals, a method of manufacturing the semiconductor element, and a semiconductor device equipped with the semiconductor elements and, more particularly, a semiconductor element, a method of manufacturing the semiconductor element, and a semiconductor device, capable of reducing a placement area of external connection terminals on an integrated circuit mounting surface.

2. Description of the Prior Art

In general, a semiconductor device comprises a semiconductor element and a package in which the semiconductor device is mounted. On a surface of the semiconductor element are formed external connection terminals (electrodes) which connect electrically an integrated circuit formed on the semiconductor element to an external device placed on the outside of the package. Lead wirings are provided on the package. The external connection terminals of the semiconductor element and the lead wirings are electrically connected indirectly via wires formed by means of wire bonding technique or directly by wireless bonding technique.

As shown in FIG. 12, an optical element 1 such as an image sensor, a solid state imaging device, etc. in the prior art includes at least a photo detector 3 and external connection terminals 5 disposed in the neighboring area of the photo detector 3 on its surface. The photo detector 3 can execute so-called photoelectric conversion to convert optical signals into electric signals. Though not shown, peripheral circuits such as a CCD (Charge Coupled Device) which can transfer sequentially the electric signals derived by photoelectric conversion by use of the photo detector 3 are disposed around the photo detector 3. The external connection terminals 5 connect electrically the photo detector 3 and the external device (not shown).

As shown in FIG. 13, an optical device 10 comprise the optical element 1 and a package 12 in which the optical element 1 is mounted. A glass lid 14 which is able to transmit the optical signals is provided on the package 12. The optical device 10 can be hermetic-sealed by the glass lid 14 and the package 12.

As shown in FIGS. 13 and 14, the lead wirings 13 are formed in the outer periphery of the optical element 1 on the package 12. In the case that the wire bonding is employed, the external connection terminals 5 of the optical element 1 and the lead wirings 13 are connected electrically by bonding wires 9. The optical element 1 is bonded to the package 12 by die bonding technique.

With the high advance and complication of LSIs in recent years, there has been a tendency that the number of terminals required for the semiconductor element is increased. However, if the number of terminals are simply increased based on a layout rule for the external connection terminals on the semiconductor element in the prior art, an increase in an element area is brought about. In order to overcome this drawback, such a method can be considered that the increase in the element area should be avoided by reducing a distance between the external connection terminals respectively. In this case, the bonding technique with extremely high accuracy is requested since the distance between the external connection terminals must be narrowed rather than that in prior art.

FIG. 15 is a sectional view showing the wire bonding which is now applied to the optical element. The bonding wire 9 is pushed against the external connection terminal 5 by use of a capillary 15 and then bonded to the external connection terminal 5 in terms of ultrasonic vibration. However, in the optical element 1 shown in FIG. 12, the external connection terminals 5 are disposed closer to each other and in addition the photo detector 3 and the external connection terminal 5 are disposed closer to each other. As a result, there has been caused such a disadvantage that a part of a surface of the external connection terminal 5 is peeled off upon bonding and then such peelings fall to the photo detector 3 and then stick thereto as adhesive substance 16. In addition, unless enough bonding accuracy can be achieved, the capillary 15 does not abut upon the external connection terminal 5 exactly, but upon a protection film coated on the surface of the optical element 1. Therefore, there has been caused another disadvantage that a part of the protection film is peeled off and then such peeled films also fall to the photo detector 3 and then stick thereto as adhesive substance 16.

As shown in FIG. 16(A), in the case that, for example, the adhesive substance 16 falls to a pixel 3c out of a plurality of pixels 3a to 3e constituting the photo detector 3, there are some cases where a white level signal which should be output properly from the pixel 3c is converted into a black level signal, as shown in FIG. 16(B), when a light is incident into the photo detector 3. As a consequence, proper signal output values cannot be output from the photo detector 3.

In order to overcome the above disadvantages, a semiconductor element set forth in Patent Application Publication (KOKAI) 3-104246 has been proposed. FIG. 17 is a view showing a configuration of the semiconductor element 1a in the prior art. In this semiconductor element 1a, the external connection terminals 5 are disposed on side surfaces of the semiconductor element 1a, so that an occupied area of the external connection terminals 5 on a surface of the semiconductor element 1a can be reduced, which results in reduction in the surface area of the semiconductor element 1a. In addition, if the semiconductor element set forth in the above Patent Application Publication (KOKAI) 3-104246 is applied to the above optical device 10, there has not been caused the disadvantage due to the adhesive substance 16 generated during wire bonding since the photo detector 3 and the external connection terminals 5 of the optical element 1 are formed on different surfaces of the optical element 1, as shown in FIG. 18.

Nevertheless, in the above semiconductor element 1a shown in FIG. 17, the external connection terminals 5 can be formed on the side surfaces of the semiconductor element 1a, but the electrical measuring electrodes 17 used to execute the electrical measurement of the integrated circuit in the course of production process (wafer process) is required separately. The electrical measuring electrodes 17 are arranged on the surface of the semiconductor element 1a as the integrated circuit mounting surface. The electrical measuring electrodes 17 and the external connection terminals 5 are connected electrically by the wirings 18 respectively, so that the external connection terminals 5 are connected electrically to the not shown integrated circuit in the semiconductor element 1a via the wirings 18 and the electrical measuring electrodes 17 respectively. In the optical device 10, the electrical measuring electrodes 17 as well as the photo detector 3 are arranged on the surface of the optical element 1 and the external connection terminals 5 are arranged on the side surfaces of the optical element 1. The occupied areas of the electrical measuring electrodes 17 are small rather than those of the external connection terminals 5. However, the occupied areas of the electrical measuring electrodes 17 are not so small as they can be neglected. For this reason, the element area of the optical element 1 cannot be sufficiently reduced because the electrical measuring electrodes 17 are required substantially as many as the external connection terminals 5.

In addition, the increase in the element area of the optical element 1 results in an increase in size of the package 12 and therefore the optical device 10 is enlarged in size.

SUMMARY OF THE INVENTION

The present invention has been made to overcome the above problems, and it is an object of the present invention to provide a semiconductor element capable of reducing an element area by reducing occupied areas of external connection terminals and electrical measuring electrodes used only in production processes. More particularly, it is an object of the present invention to provide an optical element capable of reducing an element area and also preventing degradation in characteristics due to adhesive substance being generated upon bonding.

It is another object of the present invention to provide a method of manufacturing a semiconductor element and, more particularly, a method of manufacturing an optical element capable of reducing the number of production process while achieving reduction in the element area.

It is still another object of the present invention to provide a semiconductor device capable of achieving reduction of the element area while reducing a size of a package to thus reduce a size of overall semiconductor device. More particularly, it is still another object of the present invention to provide an optical device capable of reducing a size of overall optical device.

In order to achieve the above object, according to a first aspect of the present invention, there is provided a semiconductor element comprising wirings formed on an integrated circuit mounting surface of a semiconductor chip to extend from an integrated circuit to end portions of the semiconductor chip; and external connection terminals connected to the wirings so as to connect electrically the integrated circuit and an external device arranged on an outside of the semiconductor chip, at least bonding areas of the external connection terminals being disposed only on side surfaces, a back surface, or both the side surfaces and the back surface of the semiconductor chip. The wirings are disconnected from electrical measuring electrodes which are formed on dicing lines and then connected to the external connection terminals. The wirings being extended up to an end portion of the semiconductor chip and the external connection terminals are connected electrically by terminal wiring connection members which are formed integrally with the external connection terminals and are extended from the side surface or the back surface of the semiconductor chip to the integrated circuit mounting surface respectively. The external connection terminals and the terminal wiring connection members are formed of same conductive plate material respectively. The wirings being extended up to an end portion of the semiconductor chip and the external connection terminals are connected electrically by terminal wiring connection members which are formed of material different from those of the external connection terminals and the wirings, and are extended from the side surface or the back surface of the semiconductor chip to the integrated circuit mounting surface respectively. Preferably the external connection terminals are formed of either gold bump electrodes or electrodes which are formed with use of a TAB (Tape Automated Bonding) technique. The external connection terminals are disposed on the side surfaces or the back surface of the semiconductor chip via an insulator. It is preferable that the semiconductor element further comprises a CCD (Charge Coupled Device) provided in the integrated circuit.

With the above configuration, in the semiconductor element, basically the external connection terminals are disposed only on the side surfaces, the back surface, or both the side surfaces and the back surface of the semiconductor chip. In more detail, at least bonding areas of the external connection terminals are disposed only on side surfaces, a back surface, or both the side surfaces and the back surface of the semiconductor chip. The electrical measuring electrodes used to measure electric characteristics of the integrated circuit are disposed on the dicing lines to be connected to the wirings, and then removed by dicing process after the electrical measurement (characteristic evaluation test) has been completed, so that the electrical measuring electrodes are disconnected from the wirings. The external connection terminals are connected electrically to the wirings from which the electrical measuring electrodes have been disconnected. As a consequence, the external connection terminals can be formed on the side surfaces or the back surface of the semiconductor chip. In addition, only the integrated circuit and the wirings are formed on the integrated circuit mounting surface of the semiconductor element, but the electrical measuring electrodes are not formed on the integrated circuit mounting surface of the semiconductor element. For this reason, the element surface area of the semiconductor element can be reduced.

Besides, in the case that the semiconductor element consists of the optical element which has the photo detector and the CCD in the integrated circuit, the photo detector and the external connection terminals can be formed on different surfaces of the semiconductor element respectively and therefore adhesive substance which is generated upon bonding and dropped down onto the photo detector can be lessened. For this reason, degradation in characteristics of the photo detector due to such adhesive substance can be prevented while reducing the element area.

Further, the wirings and the external connection terminals can be connected simply by the terminal wiring connection members.

According to a second aspect of the present invention, there is provided a method of manufacturing a semiconductor element comprising the steps of forming, on a surface of a semiconductor wafer, a plurality of semiconductor elements having integrated circuits therein respectively, electrical measuring electrodes arranged on dicing lines between the semiconductor elements, for measuring electric characteristics of each integrated circuit in each semiconductor element, and wirings for connecting electrically the integrated circuits and the electrical measuring electrodes; executing electrical measurement of the integrated circuits provided in the semiconductor elements by use of the electrical measuring electrodes; dividing the semiconductor wafer into individual semiconductor elements along the dicing lines and simultaneously removing the electrical measuring electrodes from the semiconductor elements; and forming external connection terminals on side surfaces or a back surface or both the side surfaces and the back surface of the semiconductor element to be electrically connected to the wirings from which the electrical measuring electrodes are removed. It is preferable that basically the electrical measuring electrodes and the wirings are formed as an identical wiring layer. Like the above, it is preferable that the semiconductor element comprises the photo detectors and CCD in the integrated circuits.

With the above configuration, the semiconductor element can be formed which enables reduction in the element area. The semiconductor element can also be formed which can prevent degradation in characteristics while reducing the element area. Since the electrical measuring electrodes can be removed at the same time dicing process is executed, the number of production process can be reduced by eliminating an individual step of removing the electrical measuring electrodes.

According to a third aspect of the present invention, there is provided a semiconductor device on which a semiconductor element is mounted, comprising a semiconductor element including the above integrated circuit, wirings, and external connection terminals; and an encapsulation package having lead wirings connected electrically to the external connection terminals of the semiconductor element thereon, the semiconductor element being mounted in the encapsulation package. As explained above, it is preferable that the semiconductor element comprises the photo detectors and CCD in the integrated circuits. The external connection terminals of the semiconductor element are connected electrically to the lead wirings of the encapsulation package by direct contact or via wires. Further, it is preferable that the semiconductor element includes a photo detector and a CCD in the integrated circuit, and the encapsulation package includes a light transmission glass provided on the photo detector to transmit optical signals, and is made of a ceramic package with high moisture resistance.

With the above configuration, since the element area of the semiconductor element can be reduced as stated above, a size reduction of the encapsulation package can be implemented so that a size reduction of the semiconductor device can be achieved. In addition, the optical device can be provided which enables a size reduction.

Other and further objects and features of the present invention will become obvious upon an understanding of the illustrative embodiments about to be described in connection with the accompanying drawings or will be indicated in appended claims, and various advantages not referred to herein will occur to one skilled in the art upon employing of the invention in practice.

DESCRIPTION OF THE PREFERRED EMBODIMENTS

Embodiment 1

Figure 1:
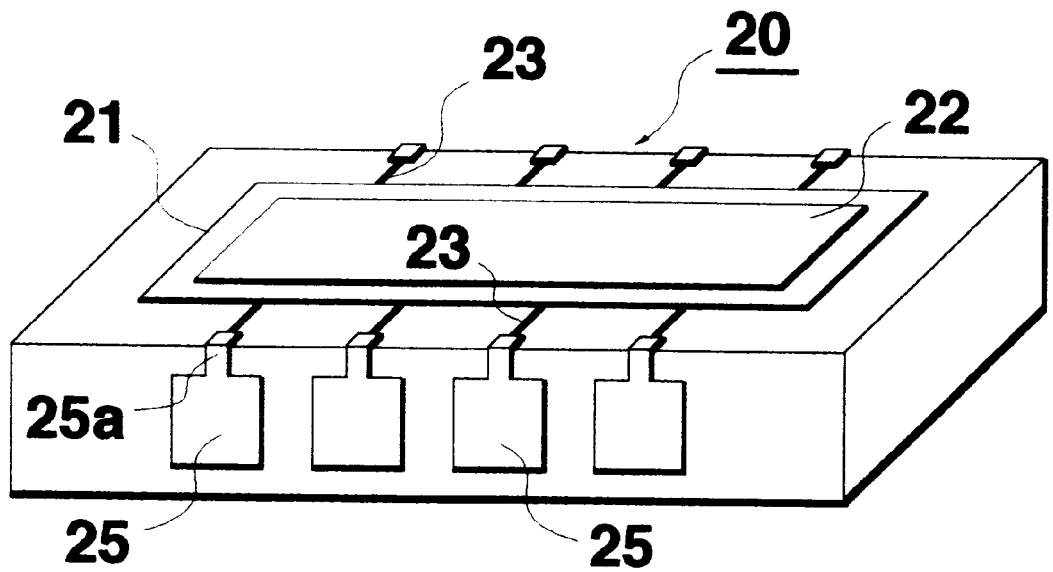
FIG. 1 is a perspective view showing a semiconductor element according to a first embodiment of the present invention.
Figure 2:
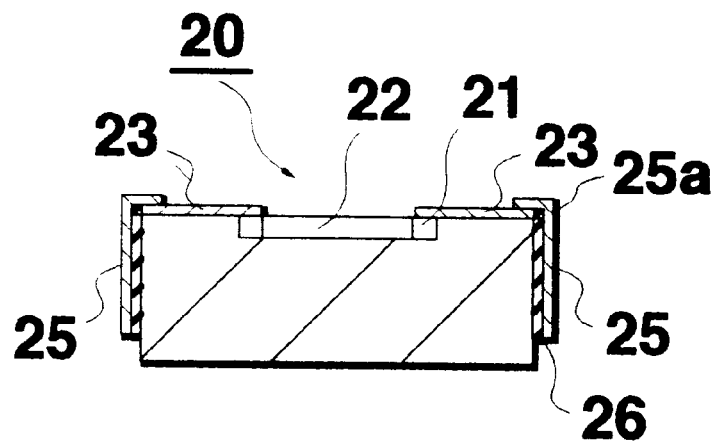
FIG. 2 is a sectional view showing the semiconductor element shown in FIG. 1.

As shown in FIGS. 1 and 2, an optical element (semiconductor element) 20 to be mounted on an optical device (30, described later) comprises an integrated circuit 21, wirings 23, and external connection terminals (electrodes) 25. The optical element 20 is formed of a semiconductor chip made of a single crystal silicon substrate. An integrated circuit 21 and the wirings 23 are disposed on an integrated circuit mounting surface of the semiconductor chip.

The integrated circuit 21 comprises a photo detector 22, and peripheral circuits such as CCD, driver circuit, signal detector circuit, etc. disposed around the photo detector 22, though not shown. The photo detector 22 is composed of pixels made up of a plurality of photodiodes, etc. which are aligned in one or two-dimensional fashion. The pixels can convert optical signals into electric signals by means of photoelectric conversion. The CCD as the peripheral circuit can transmit sequentially the electric signals derived by the photo detector 22. The driver circuit can select predetermined pixels of the photo detector 22. The signal detector circuits can detect the electric signals derived from the pixels. In other words, the optical element 20 is composed as a one-line-dimensional image sensor, a two-area-dimensional image sensor, a solid state imaging device, or the like.

The wirings 23 are formed around the integrated circuit 21 to extend from the integrated circuit 21 to end portions of the integrated circuit mounting surface. In more detail, respective wirings 23 are extended on the integrated circuit mounting surface to reach the edge of the side surface of the semiconductor chip. The wirings 23 are electrically connected to the external connection terminals 25 in one-by-one correspondence and are then connected electrically to an external device via the external connection terminals 25. More particularly, control signals for the image sensor or the solid state imaging device are input from the external device to the integrated circuit 21 via the external connection terminals 25 and the wirings 23 respectively. On the contrary, image information or picture information are output from the integrated circuit 21 to the external device. In addition, the wirings 23 are also used as test wires which transmit various signals obtained by electrical measurement (characteristic evaluation test) carried out in the course of production process.

As explained above, the external connection terminals 25 are connected electrically to the wirings 23 and thus used as terminals which connect electrically the wirings 23 and the external device. In the first embodiment, the external connection terminals 25 are aligned only on the side surfaces of the semiconductor chip which are different from the integrated circuit mounting surface of the semiconductor chip. After the above wirings 23 have been used as the test wires, electrical measuring electrodes (23T, described later) (see FIG. 3(B)) are disconnected from the wire 23 and then the external connection terminals 25 are connected electrically to the disconnected wirings 23. Respective structures of the external connection terminals 25 will be explained in detail later.

As shown in FIGS. 1 and 2, a difference between the optical element 20 according to the first embodiment and the optical element 1 and the semiconductor element 1a in the prior art resides in that both the external connection terminals 25 and the electrical measuring electrodes 23T, to be described later, are not placed on the integrated circuit mounting surface and thus the element area can be reduced sufficiently. This difference will be explained in more detail along with a manufacturing method (wafer process) of the optical element 20.

Figure 3A:
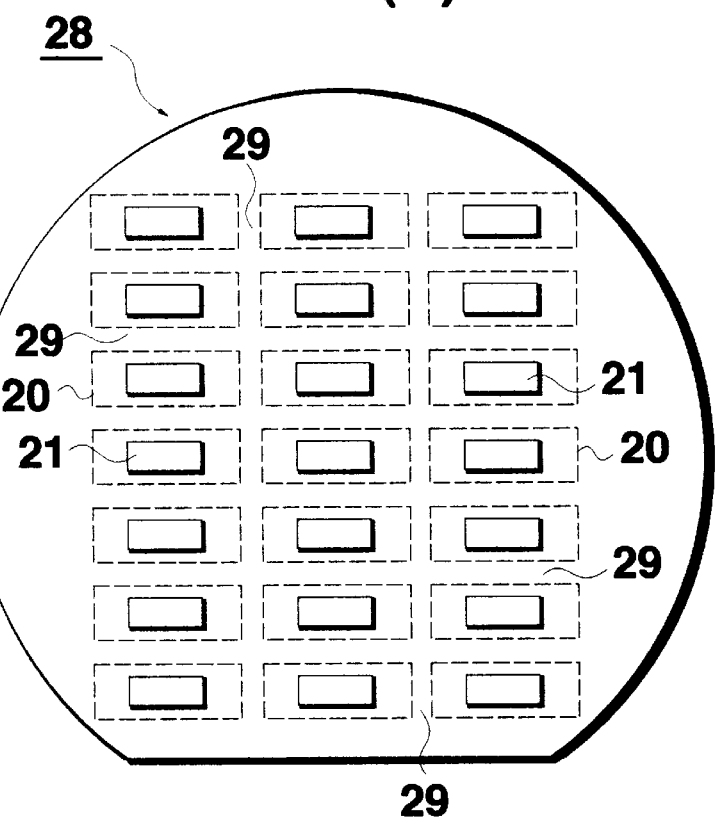
FIG. 3(A) is a plan view showing a semiconductor wafer used to explain a method of manufacturing the semiconductor element shown in FIG. 1.
Figure 3B:
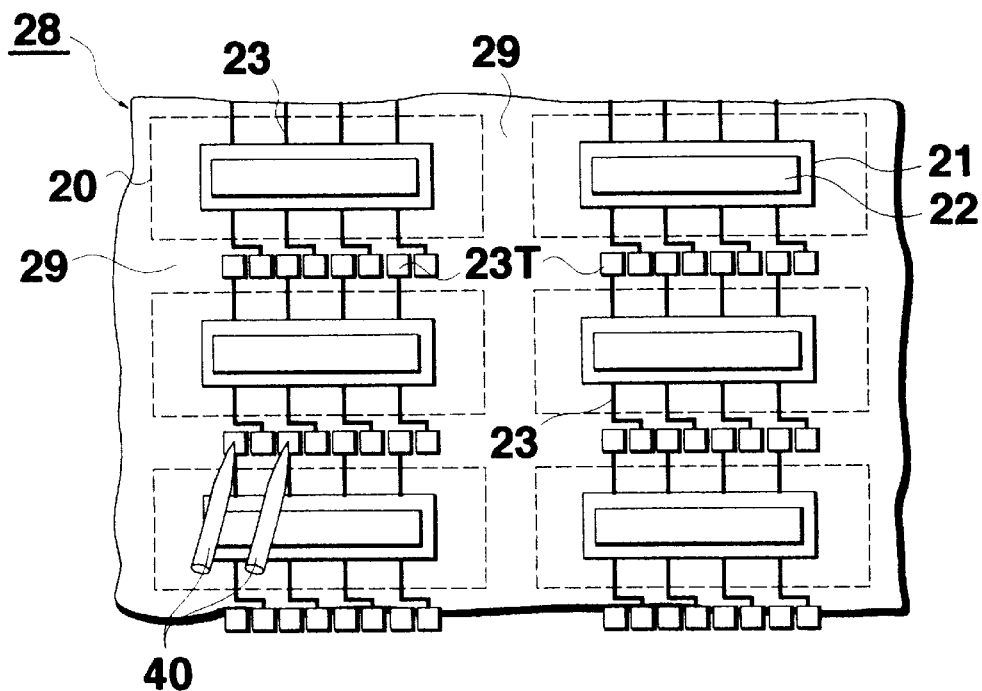
FIG. 3(B) is an enlarged plan view showing a pertinent portion of the semiconductor wafer shown in FIG. 3(A), which is now subjected to electrical measurement.

At first, as shown in FIGS. 3(A) and 3(B) respectively, the optical elements 20, the wirings 23, and the electrical measuring electrodes 23T are formed on the surface of the semiconductor wafer 28 which is made of a single crystal silicon substrate. A plurality of optical elements 20 are aligned regularly, and all adjacent optical elements 20 are formed integrally with each other in this stage. The electrical measuring electrodes 23T are formed on dicing lines (scribe areas) 29 between the optical elements 20. The wirings 23 are formed to extend from the integrated circuit 21 on the optical element 20 to the electrical measuring electrodes 23T so as to connect electrically the integrated circuit 21 and the electrical measuring electrodes 23T. The wirings 23 can be formed by a manufacturing step identical to that used for the wirings which connect respective elements or circuits in the integrated circuit 21. It is preferable that the wirings 23 and the electrical measuring electrodes 23T are formed by the same wiring layer to reduce the number of production steps. For example, the wirings 23 may be made of either a single-layer film such as aluminum thin film, aluminum alloy thin film, copper thin film, copper alloy thin film, etc. or a laminated film which is formed mainly of these thin films.

Next, as shown in FIG. 3(B), the electrical measurement (probe test) of the integrated circuit 21 of the optical element 20 is executed with the use of the electrical measuring electrodes 23T. The electrical measurement is carried out when the optical element 20 is still in its wafer state, and the selection whether the optical element 20 is good or bad can be implemented by such electrical measurement. If such quality selection of the optical elements 20 can be accomplished in their wafer state, there is no necessity of selecting the quality of every optical element 20 after a plurality of optical elements 20 have been separated from one sheet of semiconductor wafer 28 by the dicing process, and therefore wasteful packaging of defective optical elements 20 can be avoided. Accordingly, in order to carry out the electrical measurement of optical elements 20 in their wafer state, the electrical measuring electrodes 23T must be formed on the surface of the semi-conductor wafer 28 before the dicing process is executed.

The electrical measurement is carried out by bring the probe stylus 40 connected to a tester (not shown) into contact with the electrical measuring electrodes 23T so as to transmit test signals from the tester to the integrated circuit 21 via the probe stylus 40, the electrical measuring electrodes 23T, and the wirings 23 respectively.

Figure 4A:
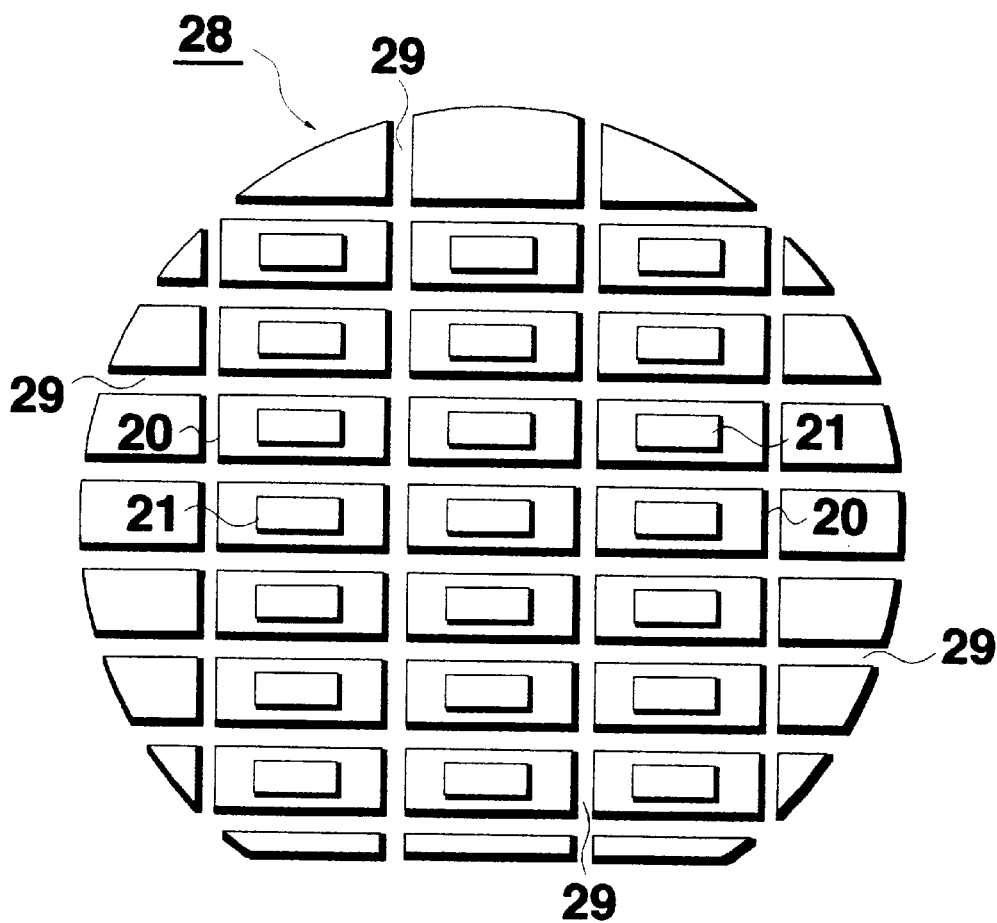
FIG. 4(A) is a plan view showing the semiconductor wafer shown in FIG. 3(A), which has undergone the dicing process.
Figure 4B:
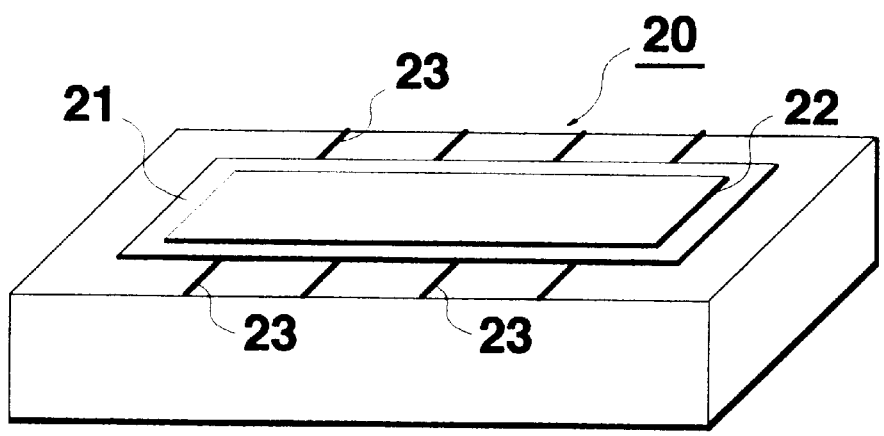
FIG. 4(B) is a perspective view showing a semiconductor element which is separated from the semiconductor wafer shown in FIG. 4(A) by the dicing process.

Next, as shown in FIGS. 4(A) and 4(B) respectively, the semiconductor wafer 28 is divided into a plurality of individual optical elements 20 by the dicing process on the dicing lines 29. In other words, such dicing process is carried out by cutting the dicing lines 29 of the semiconductor wafer 28 by a thin diamond grinding wheel (dicing saw) which is rotated at high speed. According to this dicing process, the semiconductor wafer 28 is divided into the plurality of optical elements 20 and at the same time the electrical measuring electrodes 23T formed on the surfaces of the dicing lines 29 are disconnected from the wirings 23 to be removed from respective optical elements 20. As a result, as shown in FIG. 4(B), the optical element 20 without the electrical measuring electrodes 23T can be formed.

Figure 5A:
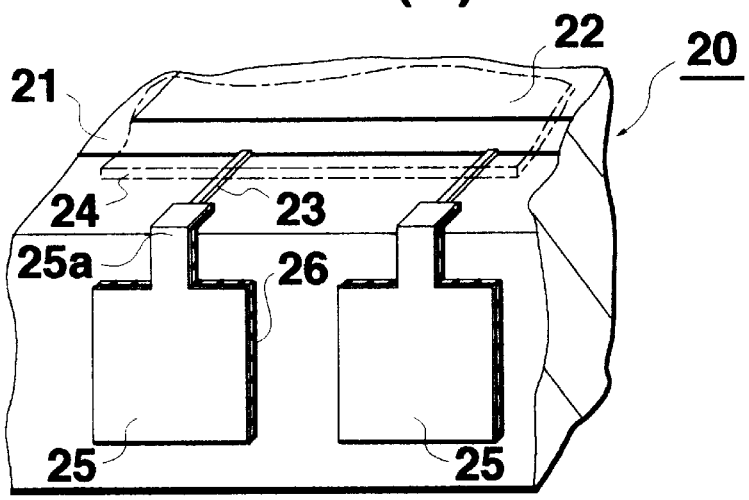
FIG. 5(A) is an enlarged perspective view showing the semiconductor element according to the first embodiment of the present invention, on which external connection terminals have been formed.

In turn, as shown FIG. 5(A), the external connection terminals 25 are fitted to the side surfaces of the optical element 20 to be connected electrically to the wirings 23. In order to connect the external connection terminal 25 to the wiring 23 formed on the integrated circuit mounting surface, a terminal wiring connection member 25a formed like an L-shape which is brought into tight contact with the side surface and the integrated circuit mounting surface of the optical element 20 respectively is formed integrally with the external connection terminal 25. In other words, the terminal wiring connection members 25a are formed to be extended from the external connection terminals 25. In the present invention, if the external connection terminals 25 serving as bonding pads to connect the optical element 20 to the external device are formed on the side surfaces of the optical element 20, the terminal wiring connection members 25a which are formed integrally with the external connection terminals 25 may be extended onto the integrated circuit mounting surface of the optical device 20. The external connection terminals 25 and the terminal wiring connection members 25a are made of conductive plate material such as copper plate or gold plate, for example. The terminal wiring connection members 25a are formed by machining, for example. The terminal wiring connection members 25a formed as above are able to connect easily the external connection terminals 25 and the wirings 23.

The external connection terminals 25 are fitted to the side surface of the optical element 20 via an insulating film 26 respectively. For instance, a resin film having adhesive property such as epoxy resin film, polyimide resin film, etc. may be employed as the insulating film 26.

The terminal wiring connection members 25a which are formed integrally with the external connection terminals 25 and folded to the integrated circuit mounting surface side come directly into contact with the wiring 23. In such contacting area, the wiring 23 is exposed from a protection film 24. The protection film 24 covers a substantially whole area of the integrated circuit mounting surface of the optical element 20 such as the integrated circuit 21, the wirings 23, etc.

Figure 5B:
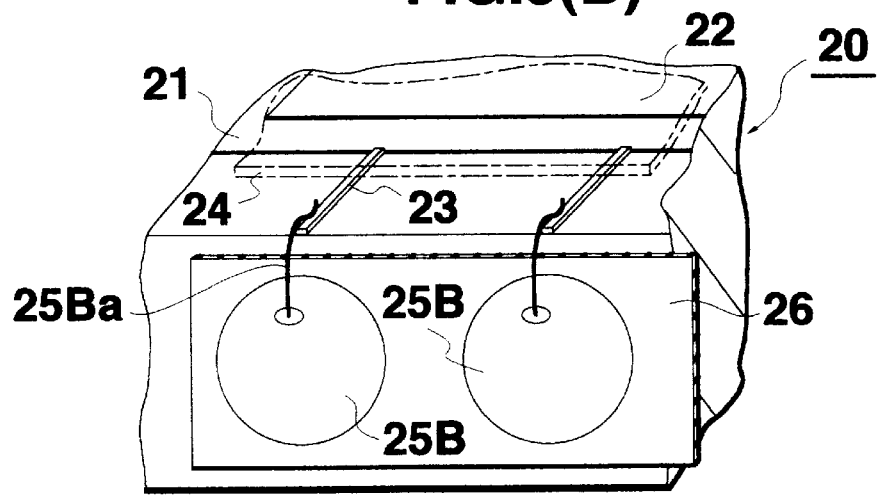
FIG. 5(B) is an enlarged perspective view showing the semiconductor element according to a modification of the first embodiment of the present invention, on which another external connection terminals have been formed.
Figure 5C:
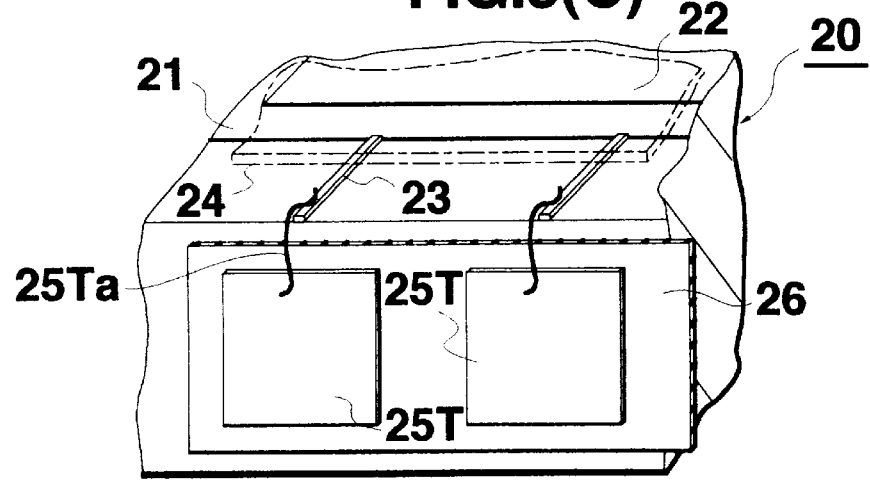
FIG. 5(C) is an enlarged perspective view showing the semiconductor element according to another modification of the first embodiment of the present invention, on which still another external connection terminals have been formed.

Moreover, any of gold bump electrodes (projection electrodes) 25B shown in FIG. 5(B) and TAB electrodes 25T formed by a TAB (Tape Automated Bonding) technique shown in FIG. 5(C) may be employed as the external connection terminal 25.

The gold bump electrodes 25B shown in FIG. 5(B) are formed by bonding gold balls on a surface of the insulating film 26 with the use of a bump bonder like the wire bonder. The gold balls per se can be used as the external connection terminal 25. Such gold ball is formed by heating a top end of the gold wire and then working the heated top end into a ball shape. A rear end side of the gold wire is used as a terminal wiring connection member 25Ba which is bonded to the wiring 23. If the gold bump electrode 25B is used as the external connection terminal 25, such material that has high junction property with gold is formed at least on an uppermost layer of the insulating film 26.

The TAB electrodes 25T formed by the TAB technique shown in FIG. 5(C) are formed on a surface of the tape type insulating film 26 having adhesive property. The TAB electrodes 25T and the wirings 23 are connected electrically via terminal wiring connection members 25Ta which are extended from the side surfaces to the integrated circuit mounting surface of the optical element 20. For example, a polyimide resin tape may be used as the insulating film 26, and the gold wire may be used as the terminal wiring connection member 25Ta. The gold wire can be bonded by the ordinary wire bonding technique. The terminal wiring connection member 25Ta is formed of material different from those of the wiring 23 and the TAB electrodes 25T.

Figure 6:
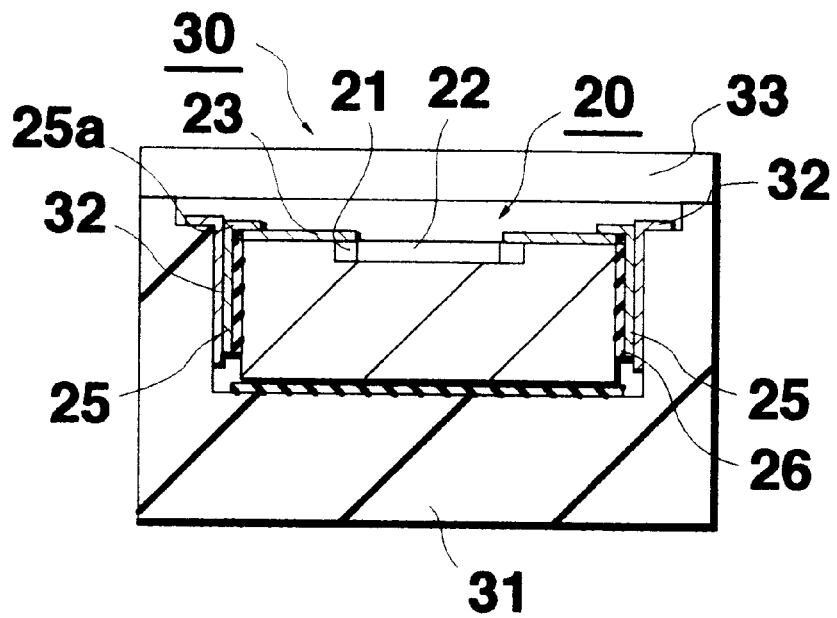
FIG. 6 is a sectional view showing a semiconductor device in which the semiconductor element shown in FIG. 1 is mounted.

After the above wafer process has been completed and, as shown in FIG. 5(A) (or FIG. 5(B) or FIG. 5(C)), the external connection terminals 25 have been fitted to the side surfaces of the optical element 20, the optical element 20 is then packaged to thus complete an optical device 30, as shown in FIG. 6. The optical device 30 comprises the optical element 20 and a package 31 which can hermetic-seal the optical element 20 therein.

The package 31 includes a light transmission glass (glass lid or window) 33 over the photo detector 23 of the optical element 20 so as to input optical signals into the photo detector 23. For example, borosilicate glass may be used as the light transmission glass 33. In addition, a cavity in which the optical element 20 is placed is formed in the package 31. Lead wirings 32 which are to be connected electrically to the external connection terminals 25 of the optical element 20 are formed on a surface of the cavity.

In the first embodiment, the external connection terminals 25 of the optical element 20 are brought into contact directly with the lead wirings 32 by means of wireless bonding. For instance, solder may be employed to bond the external connection terminals 25 and the lead wirings 32. In the event that such wireless bonding is employed, the size reduction of the package 31 can be achieved since occupied area required for routing of the wires can be reduced.

The package 31 may be formed by a ceramic package or a plastic package. If moisture resistance is required for the package, the ceramic package will be utilized. If cost of the package has to be suppressed lower, the plastic package will be utilized. Further, the lead wirings 23 may be formed of aluminum clad or copper clad, for example.

Embodiment 2

Figure 7:
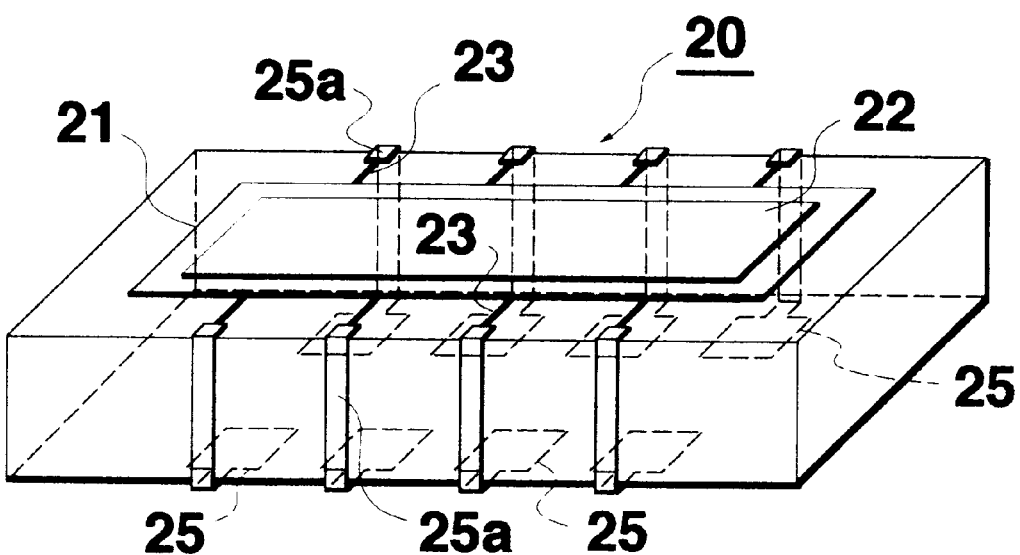
FIG. 7 is a perspective view showing a semiconductor element according to a second embodiment of the present invention.
Figure 8:
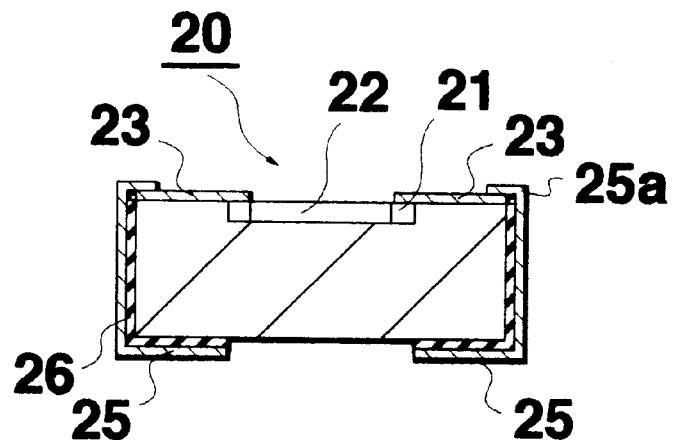
FIG. 8 is a sectional view showing the semiconductor element shown in FIG. 7.

In a second embodiment, the external connection terminals 25 are formed on the back surface of the optical element 20. As shown in FIGS. 7 and 8, the external connection terminals 25 are arranged on the back surface of the semiconductor chip, i.e., the surface opposing to the integrated circuit mounting surface of the optical element 20.

Figure 9:
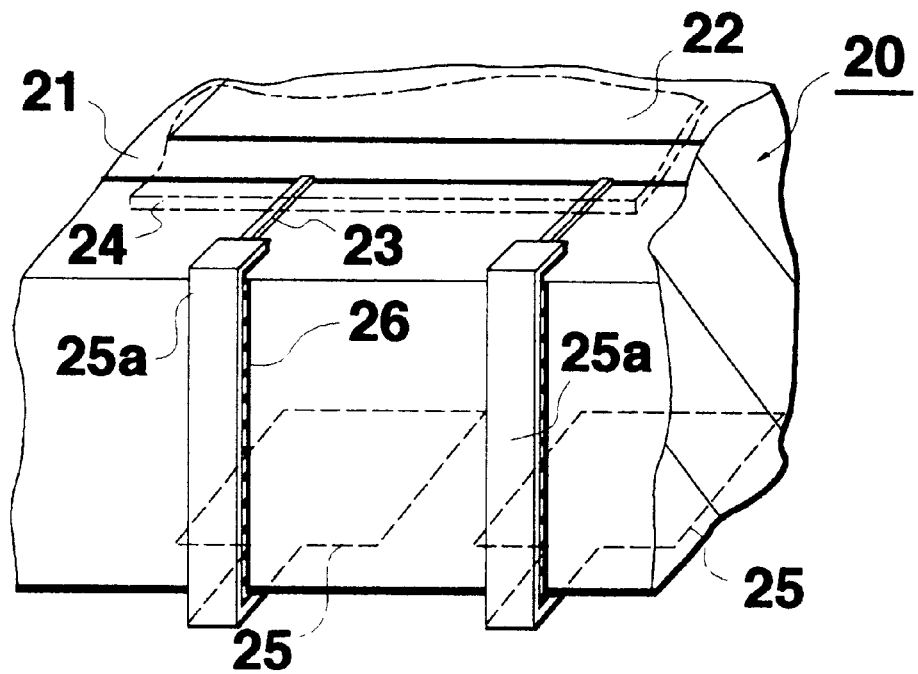
FIG. 9 is an enlarged perspective view showing the semiconductor element shown in FIG. 7.

As shown in FIG. 9, in order to connect electrically the external connection terminal 25 placed on the back surface of the optical element 20 to the wiring 23 formed on the integrated circuit mounting surface, terminal wiring connection members 25a each formed like a C-shape which is brought into tight contact with the back surface, the side surface, and the integrated circuit mounting surface of the optical element 20 respectively so as to be extended from the back surface to the integrated circuit mounting surface via the side surface are formed integrally with the external connection terminals 25. In the present invention, like the first embodiment, if the external connection terminals 25 are formed on the side surfaces of the optical element 20, the terminal wiring connection members 25a which are formed integrally with the external connection terminals 25 may be extended onto the integrated circuit mounting surface of the optical element 20. Since a basic structure of the external connection terminal 25 is similar to that of the external connection terminal 25 in the above first embodiment, its explanation will be omitted in the second embodiment.

Figure 10:
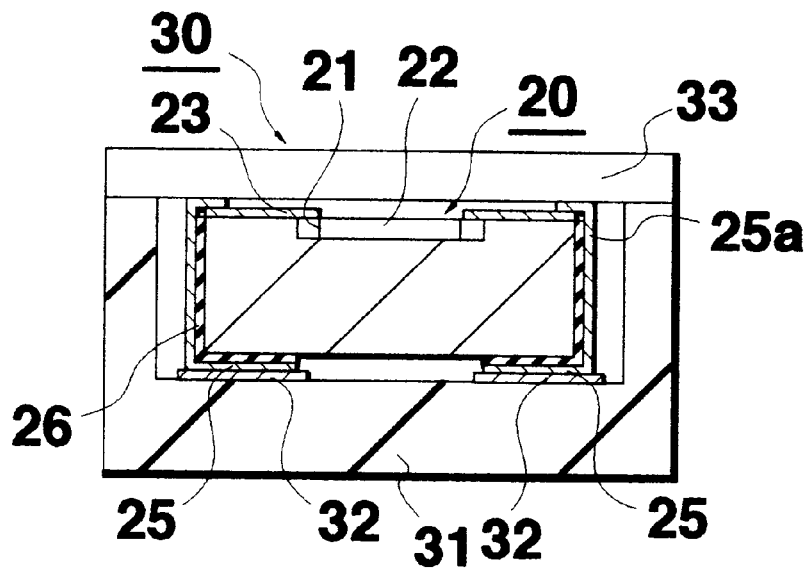
FIG. 10 is a sectional view showing another semiconductor device in which the semiconductor element shown in FIG. 7 is mounted.

As shown in FIG. 10, the optical element 20, on the back surface of which the external connection terminals 25 are aligned, is packaged in the package 31, so that the optical device 30 is completed. On the bottom surface of the cavity of the package 31 are formed previously the lead wirings 32 which are connected, by means of wireless bonding, to the external connection terminals 25 which are formed on the back surface of the optical element 20.

Further, as shown in FIG. 10, the optical device 30 can be packaged by bringing the photo detector 22 previously into direct contact with the back surface of the light transmission glass 33, then mounting the optical element 20 on the light transmission glass 33, and then installing the optical element 20 in the package 31. In the optical device 30 formed in this manner, adhesion of foreign substance such as dust, etc. between the photo detector 22 for photoelectric conversion and the light transmission glass 33 can be prevented and therefore defects due to such adhesion of the foreign substance can be reduced.

Figure 11:
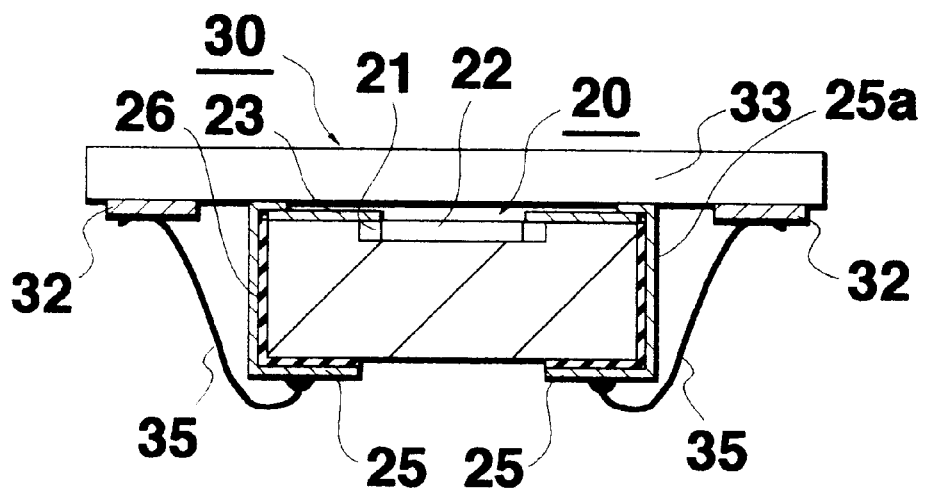
FIG. 11 is a sectional view showing still another semiconductor device in which the semiconductor element shown in FIG. 7 is mounted.
Figure 12:
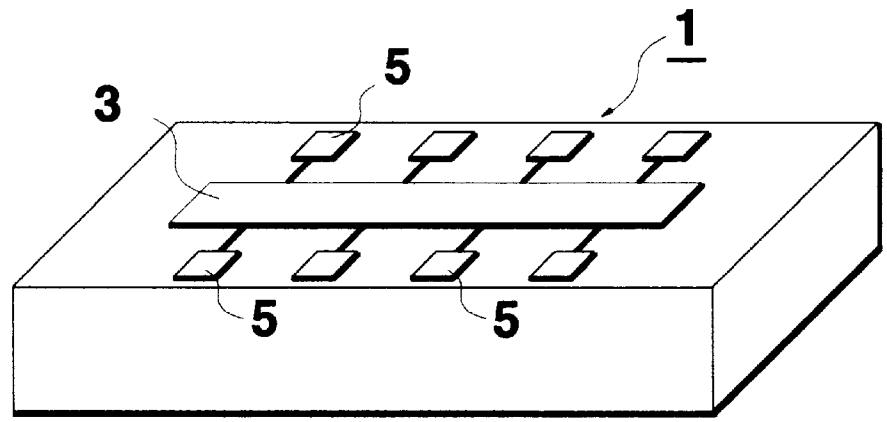
FIG. 12 is a perspective view showing an optical element as a semiconductor element in the prior art.
Figure 13:
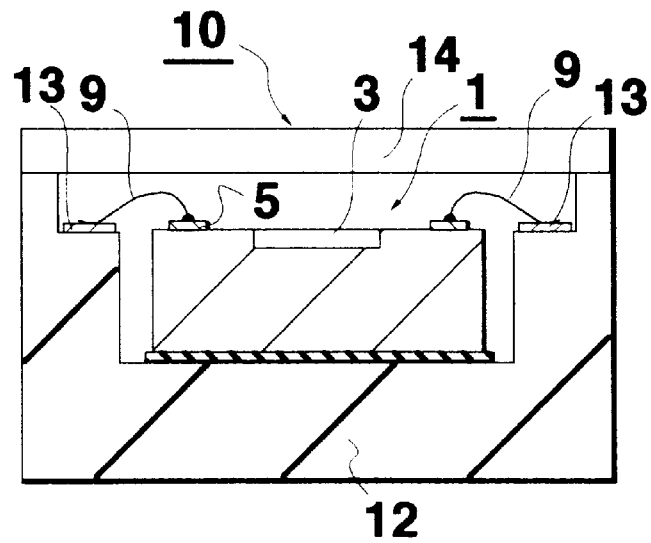
FIG. 13 is a sectional view showing an optical device in the prior art on which the optical element in FIG. 12 is mounted.
Figure 14:
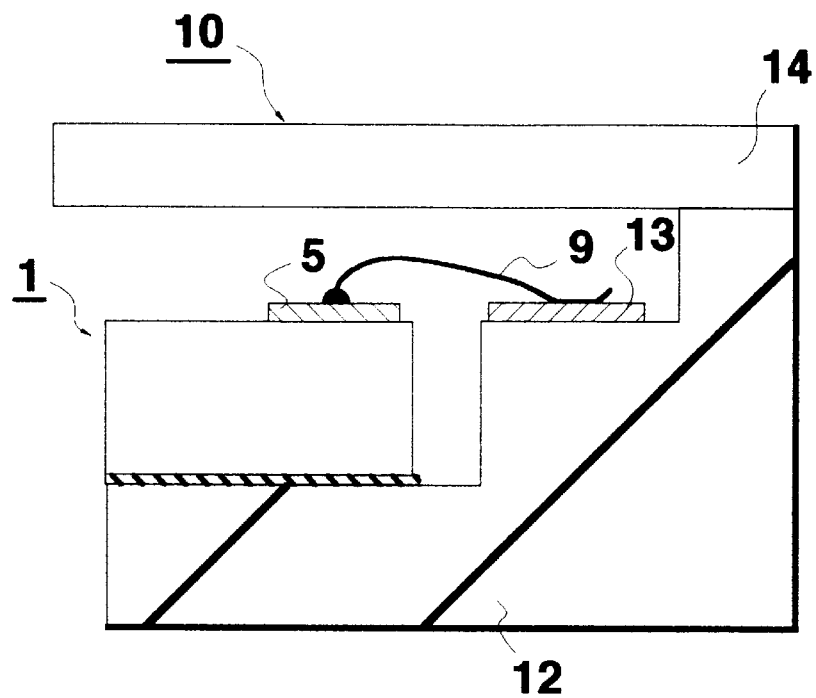
FIG. 14 is an enlarged sectional view showing a pertinent portion of the optical device shown in FIG. 13.
Figure 15:
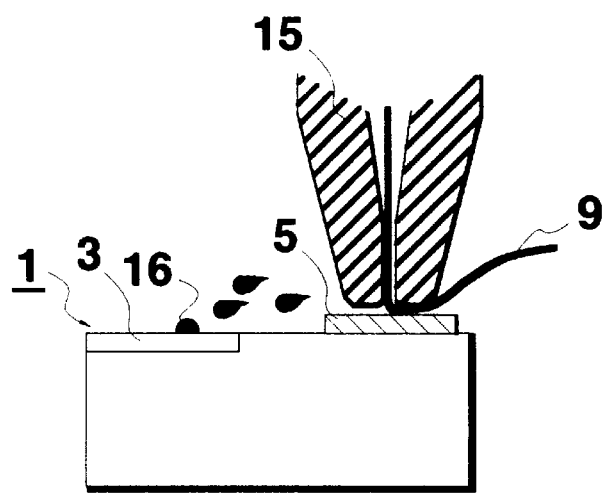
FIG. 15 is a fragmental sectional view showing the optical device shown in FIG. 13, which is now being subjected to wire bonding.
Figure 16A:
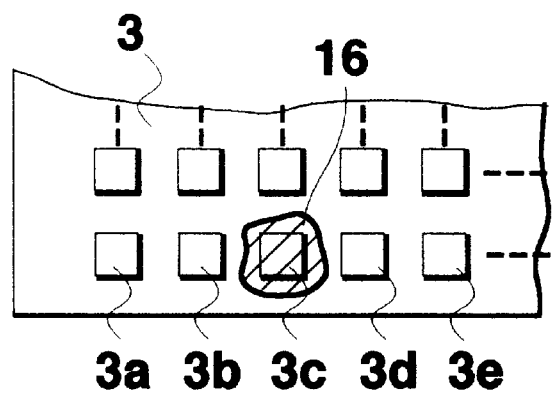
FIG. 16(A) is a fragmental plan view showing the optical element in the prior art.
Figure 16B:
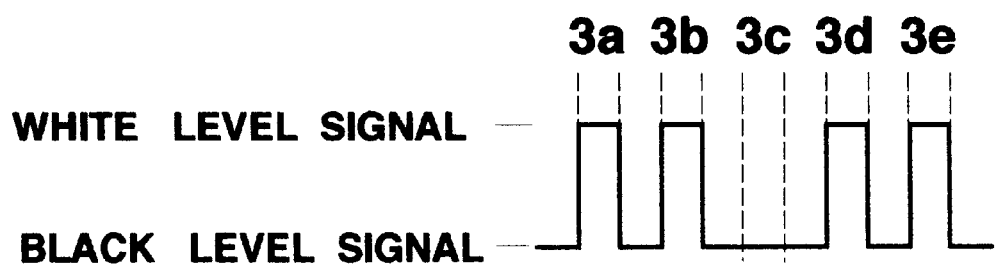
FIG. 16(B) is a view showing output signal values which are output from the optical element in the prior art.
Figure 17:
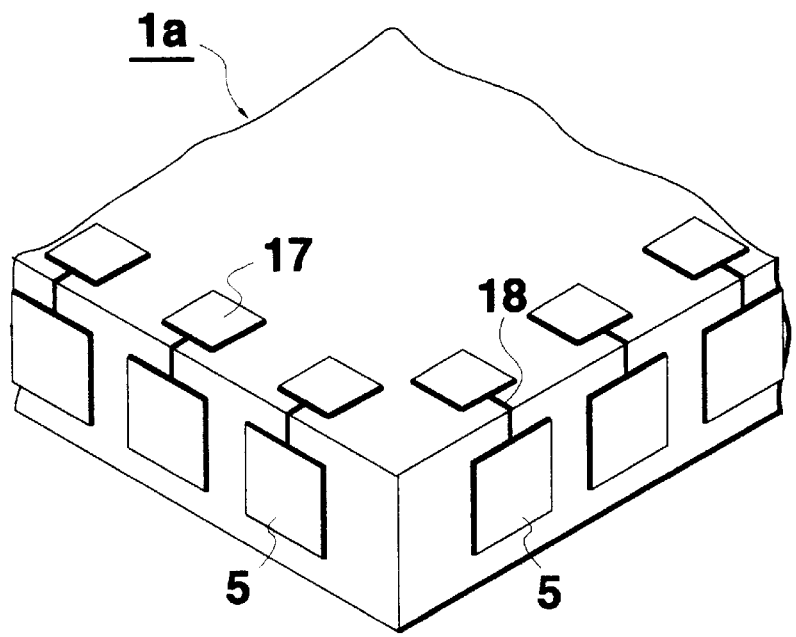
FIG. 17 is a perspective view showing a semiconductor element in the prior art.
Figure 18:
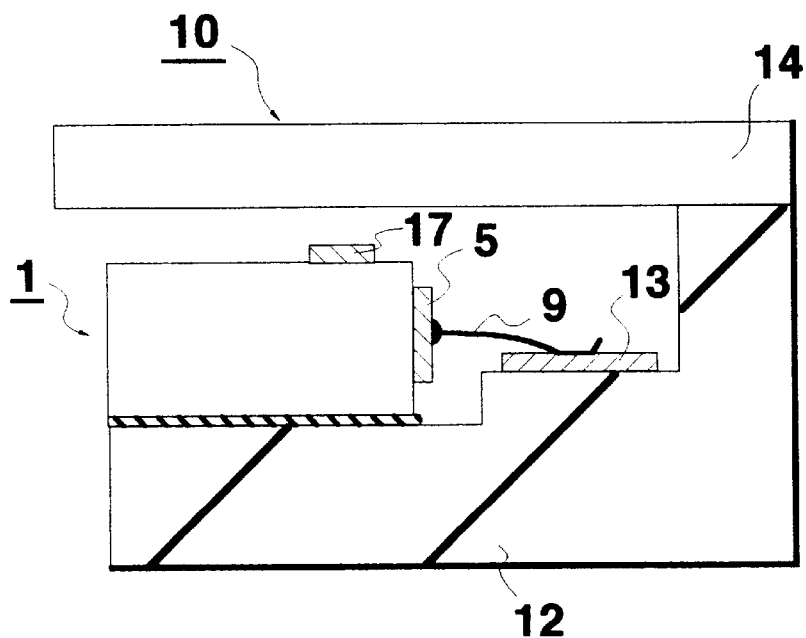
FIG. 18 is an enlarged sectional view showing a pertinent portion of the optical device in the prior art.

Furthermore, as shown in FIG. 11, while the photo detector 22 and the back surface of the light transmission glass 33 are brought into contact with each other, the optical element 20 in which the external connection terminals 25 are aligned on its back surface can be mounted directly on the back surface of the light transmission glass 33 which has the lead wirings 32 on its back surface. The external connection terminals 25 formed on the back surface of the optical element 20 and the lead wirings 32 formed on the back surface of the light transmission glass 33 are connected electrically by bonding wires 35. In the optical device 30 thus formed, size reduction can be implemented much more since the package 31 can be neglected.

As explained as above, in the present invention, in essence the external connection terminals 25 are arranged only on the side surfaces, the back surface, or both the side surfaces and the back surface of the optical element 20. The electrical measuring electrodes 23T used to measure electric characteristics of the integrated circuit 21 are arranged on the dicing lines 29 so as to be connected to the wirings 23 and then removed by dicing process after the electrical measurement has been completed, so that the electrical measuring electrodes 23T are disconnected from the wirings 23. The external connection terminals 25 are connected electrically to the wirings 23 from which the electrical measuring electrodes 23T have been disconnected. Accordingly, the external connection terminals 25 can be formed on the side surfaces or the back surface of the optical element 20. Only the integrated circuit 21 and the wirings 23 are formed on the integrated circuit mounting surface of the optical element 20, but the electrical measuring electrodes 23T are not formed on the integrated circuit mounting surface of the optical element 20. Consequently, the element surface area of the optical element 20 can be reduced.

In addition, in the case that the semiconductor element consists of the optical element 20 which has the photo detector 22 and the CCD in the integrated circuit 21, the photo detector 22 and the external connection terminals 25 can be formed on different surfaces of the optical element 20 respectively and as a result adhesive substance which is generated upon bonding and dropped down onto the photo detector 22 can be lessened. Therefore, degradation in characteristics of the photo detector 22 due to such adhesive substance can be prevented while reducing the element area.

Moreover, according to the present invention, in the manufacturing method of the semiconductor element 20, the number of production process can be reduced by eliminating an individual step of removing the electrical measuring electrodes 23T since the electrical measuring electrodes 23T can be removed at the same time when dicing process is executed.

Furthermore, in the present invention, since the element area of the optical element 20 can be reduced as stated above, a size reduction of the package 31 can be implemented so that a size reduction of the optical device 30 can be achieved.

The present invention should be interpreted not to be limited to the above embodiments. For instance, in the present invention, the external connection terminals 25 may be provided previously to the lead wirings 32 of the package 31 in positions corresponding to the side surfaces, the back surface, or both the side surfaces and the back surface of the optical element 20 and then the external connection terminals 25 and the wirings 23 of the optical element 20 may be connected electrically. Otherwise, the lead wirings per se may be formed as the external connection terminals 25.

Furthermore, the present invention is not limited to the optical element 20 such as the image sensor, the solid state imaging device, etc. For example, the present invention may be applied to other optical elements such as a photo detector without the CCD used in a photo coupler. In addition, the present invention may be applied to all semiconductor elements such as memory element, logical element, etc. According to the present invention, the semiconductor devices in which these semiconductor elements are mounted respectively can achieve the same advantages as those as described above.

Various modifications will become possible for those skilled in the art after receiving the teachings of the present disclosure without departing from the scope thereof.

What is claimed is:

1. A semiconductor element comprising:
   (a) wirings formed on an integrated circuit mounting surface of a semiconductor chip to extend from an integrated circuit to end portions of the semiconductor chip which reach the edge of the side surface of the semiconductor chip;
   (b) external connection terminals formed so as to connect electrically an external device arranged on an outside of the semiconductor chip, at least bonding areas of the external connection terminals being disposed only on side surfaces, a back surface, or both the side surfaces and the back surface of the semiconductor chip;
   (c) terminal wiring connection members formed integrally with the external connection terminals, extending on the side surface or the back surface of the semiconductor chip and the integrated circuit mounting surface, and connected to the wirings; and
   (d) insulators having an adhesive property disposed between at least one of the side surfaces or the back surface of the semiconductor chip and the external connection terminals.

2. The semiconductor element of claim 1, wherein the wirings extended up to an end portion of the semiconductor chip and the external connection terminals are connected electrically by terminal wiring connection members which are formed of material different from those of the external connection terminals and the wirings, and are extended from the side surface or the back surface of the semiconductor chip to the integrated circuit mounting surface respectively.

3. The semiconductor element of claim 1, wherein the external connection terminals and the terminal wiring connection members are formed of the same conductive plate material.

4. The semiconductor element of claim 1, wherein the external connection terminals are formed of gold bump electrodes.

5. The semiconductor element of claim 2, wherein the external connection terminals are formed of electrodes which are formed with use of a TAB (Tape Automated Bonding) technique.

6. The semiconductor element of claim 1, further comprising a photo detector provided in the integrated circuit to execute photoelectric conversion.

7. The semiconductor element of claim 6, further comprising a CCD (Charge Coupled Device) provided in the integrated circuit.

8. The semiconductor element of claim 1, wherein electrical measuring electrodes are not on the integrated circuit mounting surface.

9. The semiconductor element of claim 1, wherein a photo detector is formed on the integrated circuit mounting surface.

10. A semiconductor device on which a semiconductor element is mounted, comprising:

(a) a semiconductor element including, an integrated circuit, wirings extended from the integrated circuit to end portions on an integrated circuit mounting surface of a semiconductor chip which reach the edge of the side surface of the semiconductor chip, external connection terminals formed so as to connect electrically an external device arranged on an outside of the semiconductor chip, at least bonding areas of the external connection terminals being disposed only on side surfaces, a back surface, or both the side surfaces and the back surface of the semiconductor chip, terminal wiring connection members formed integrally with the external connection terminals, extending on the side surface or the back surface of the semiconductor chip and the integrated circuit mounting surface, and connected to the wirings; and insulators having an adhesive property disposed between at least one of the side surfaces or the back surface of the semiconductor chip and the external connection terminals; and (b) an encapsulation package having lead wirings connected electrically to the external connection terminals of the semiconductor element mounted in the encapsulation package.

11. The semiconductor device of claim 10, wherein the external connection terminals of the semiconductor element and the lead wirings of the encapsulation package are connected electrically to each other by direct contact or via wires.

12. The semiconductor device of claim 10, wherein the semiconductor element includes a photo detector and a CCD in the integrated circuit, and the encapsulation package includes a light transmission glass provided on the photo detector for transmitting optical signals, and is made of a ceramic package.

13. The semiconductor device of claim 10, wherein electrical measuring electrodes are not on the integrated circuit mounting surface.

14. The semiconductor device of claim 10, wherein the semiconductor element includes a photo detector.

* * * * *